United States Patent [19]

Ishiguro et al.

[11] Patent Number: 5,014,017

[45] Date of Patent: May 7, 1991

[54] POWER-SAVING LOW-FREQUENCY POWER AMPLIFIER

[75] Inventors: Kazuhisa Ishiguro, Nitta; Yutaka Sekiguchi, Oora, both of Japan

[73] Assignee: Sanyo Electric Co., Ltd., Osaka, Japan

[21] Appl. No.: 392,365

[22] Filed: Aug. 10, 1989

[30] Foreign Application Priority Data

Aug. 12, 1988 [JP] Japan .................................. 63-202226

[51] Int. Cl.⁵ ............................................. H03F 3/183
[52] U.S. Cl. .................................... 330/51; 330/261; 330/267; 330/296; 379/395
[58] Field of Search ................. 330/51, 200, 204, 261, 330/267, 273, 296; 379/390, 395

[56] References Cited

U.S. PATENT DOCUMENTS

| | | |
|---|---|---|
| 3,867,709 | 2/1975 | Seki et al. |
| 4,315,221 | 2/1982 | Numata et al. .................. 330/51 |
| 4,546,327 | 10/1985 | Suzuki et al. .................. 330/51 X |
| 4,853,648 | 8/1989 | Imanishi ........................... 330/51 X |

FOREIGN PATENT DOCUMENTS

| | | |
|---|---|---|
| 0043707 | 7/1981 | European Pat. Off. |
| 0106953 | 8/1983 | European Pat. Off. |
| 0159079 | 3/1985 | European Pat. Off. |
| 147304 | 9/1982 | Japan .................................. 330/51 |

Primary Examiner—James B. Mullins
Attorney, Agent, or Firm—Darby & Darby

[57] ABSTRACT

A power saving low frequency power amplifier includes a first stage amplifier for receiving and amplifying data signal, a second stage amplifier for amplifying the output of the first stage amplifier, and a power amplifier for amplifying the output of the second amplifier. The first stage amplifier is operated in response to a driving current. The second stage amplifier receives a first idling current for obtaining a predetermined amplification, and the power amplifier receives a second idling current for obtaining a predetermined amplification. A first switching circuit is provided for making and braking paths for the first and second idling currents provided for producing a power save signal to the first switching means for braking the first switching circuit when the power save signal is present.

9 Claims, 6 Drawing Sheets

POWER-SAVING LOW-FREQUENCY POWER AMPLIFIER

BACKGROUND OF THE INVENTION

1. Field of the Invention

The present invention relates to a power-saving low-frequency power amplifier, and more particularly, to a circuit adapted to restrict the power consumption in an amplifier circuit of low frequency power in a system having a waiting condition for an irregular time interval.

2. Description of the Prior Art

Recently, many developments have been made on pocket size receiver, for example, cordless telephones, radio pagers or portable telephones, which can effect wireless communication between a base unit and a handset unit.

The handset unit of the above described type is generally operated by a battery, and usually has a waiting (or stand-by) state during which the circuit power is cut off so as to prevent the power consumption therein, and a operating (or in-use) state during which the circuit is energized to effect the amplification of the received signal. The setting of the stand-by state or operating state is effected by a control signal produced from CPU (central processing unit).

Figure 1:
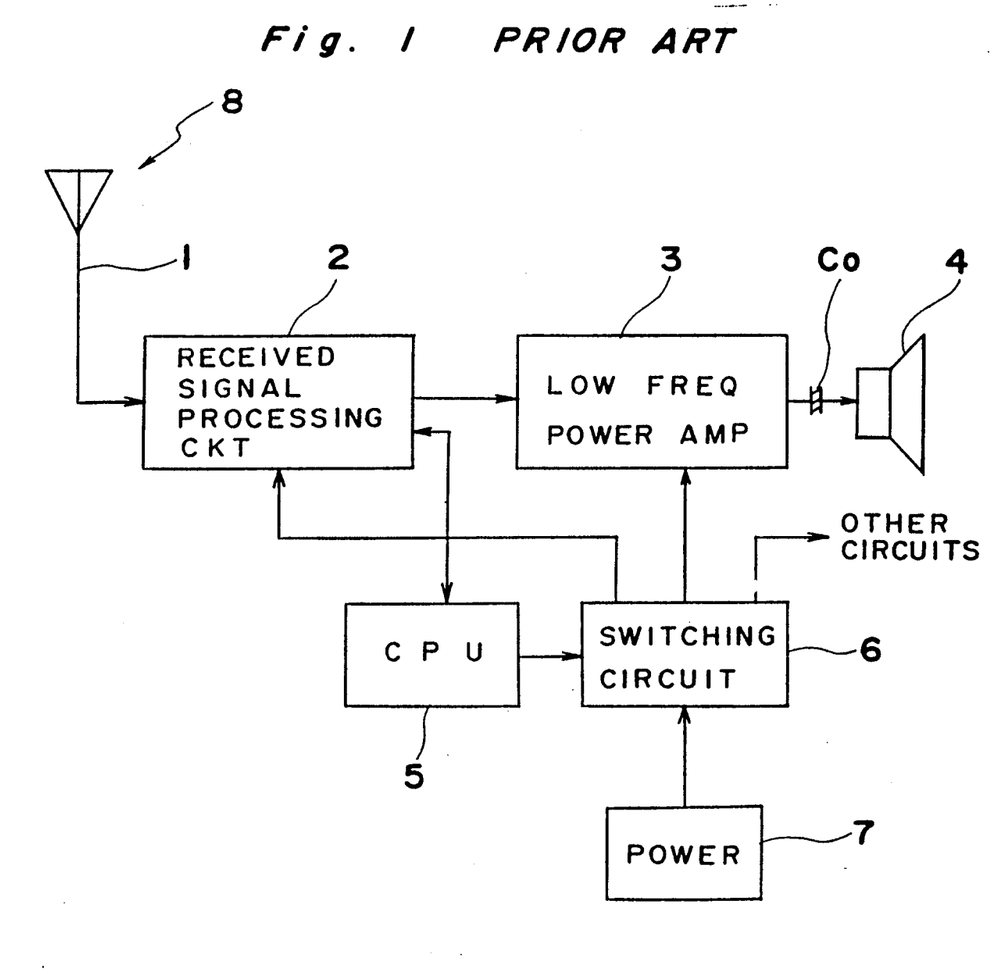
FIG. 1 is a block diagram of a prior art telephone handset employing power-saving low frequency power amplifier.

In FIG. 1, a block diagram of a prior art powersaving low-frequency power amplifier is shown, which is employed in a handset unit such as in a handset of cordless telephone. In FIG. 1, the handset unit includes an antenna 1 for receiving electric waves 8 from the base unit (not shown), a processing circuit 2 for processing the received signals, a low frequency power amplifier 3 for amplifying low frequency signal, a speaker 4 connected to low frequency power amplifier 3 through an output coupling capacitor Co, a CPU 5 and a switching circuit 6 coupled with a power source 7 such as a battery. By the control of CPU, the electric power from power source 7 is supplied through switching circuit 6 to processing circuit 2, amplifier 3, CPU 5, and other circuits.

When the handset unit employs an intermittent power saving system, CPU 5 produces the control signal which is a pulse signal having a predetermined frequency. During the pulse period, it is detected whether any data signal is being transmitted to the handset unit, or not, at received signal processing circuit 2. If no data signal is being received, switching circuit 6 continues to provide no electric power to low frequency power amplifier 3. If, on the other hand, data signal is received during the pulse period, CPU 5 controls switching circuit 6 to start providing electric power to low frequency power amplifier 3. Thus, output coupling capacitor Co for DC cutting is charged rapidly. By such a rapid electric charge in the output coupling capacitor Co, speaker 4 produces short but annoying shock noise each time when the low frequency power amplifier 3 is powered.

When the handset unit employs an active/inactive power saving system, CPU 5 produces the control signal which is an ID signal indicating the presence and absence of the data signal from the base unit. When the ID signal from the base unit is not detected, the switching circuit 6 provides no electric power to the low frequency power amplifier 3 to maintain the amplifier 3 in inactive condition. On the other hand, when the ID signal from the base unit is detected, the switching circuit 6 provides electric power to the low frequency power amplifier 3 to switch on the amplifier 3 in active condition. When the low frequency power amplifier 3 is powered on, speaker 4 produces the same annoying shock noise due to the rapid electric charge in the output coupling capacitor Co.

As described above, although the low frequency power amplifier 3 is switched between power on and power off conditions to save the battery power while the handset unit is not in use, undesirable shock noise is produced from the speaker 4 each time the low frequency power amplifier 3 is powered on.

SUMMARY OF THE INVENTION

The present invention has been developed with a view to substantially solving the above described disadvantages and has for its essential object to provide an improved power saving low frequency power amplifier which will not produce any shock noise when the low frequency power amplifier is powered on.

In accomplishing these and other objects, a power saving low frequency power amplifier according to the present invention employs an active/semi-active power saving system, and which comprises: a first stage amplifier for receiving and amplifying data signal, said first stage amplifier being operated in response to a driving current; a second stage amplifier for amplifying the output of said first stage amplifier, said second stage amplifier receiving a first idling current for obtaining a predetermined amplification; a power amplifier for amplifying the output of said second amplifier, said power amplifier receiving a second idling current for obtaining a predetermined amplification; a first switching means for making and breaking paths for said first and second idling currents; and a control means for producing a power save signal to said first switching means for breaking said first switching means when said power save signal is present.

Furthermore, a power saving low frequency power amplifier according to the present invention further comprises a negative feedback circuit connected between the output of said power amplifier and input of said first stage amplifier so that the output from said power amplifier is maintained stable even when said first switching means breaks said paths for said first and second idling currents.

Furthermore, power saving low frequency power amplifier according to the present invention further comprises a second switching means for restricting the supply of said driving current to said first stage amplifier when said power saving signal is present.

Moreover, a power saving low frequency power amplifier according to the present invention further comprises a third switching means for supplying two kinds of DC current to said first stage amplifier in accordance said power saving signal.

BRIEF DESCRIPTION OF THE DRAWINGS

These and other objects and features of the present invention will become apparent from the following description taken in conjunction with preferred embodiments thereof with reference to the accompanying drawings, throughout which like parts are designated by like reference numerals, and in which.

DETAILED DESCRIPTION OF THE PREFERRED EMBODIMENTS

Figure 2:
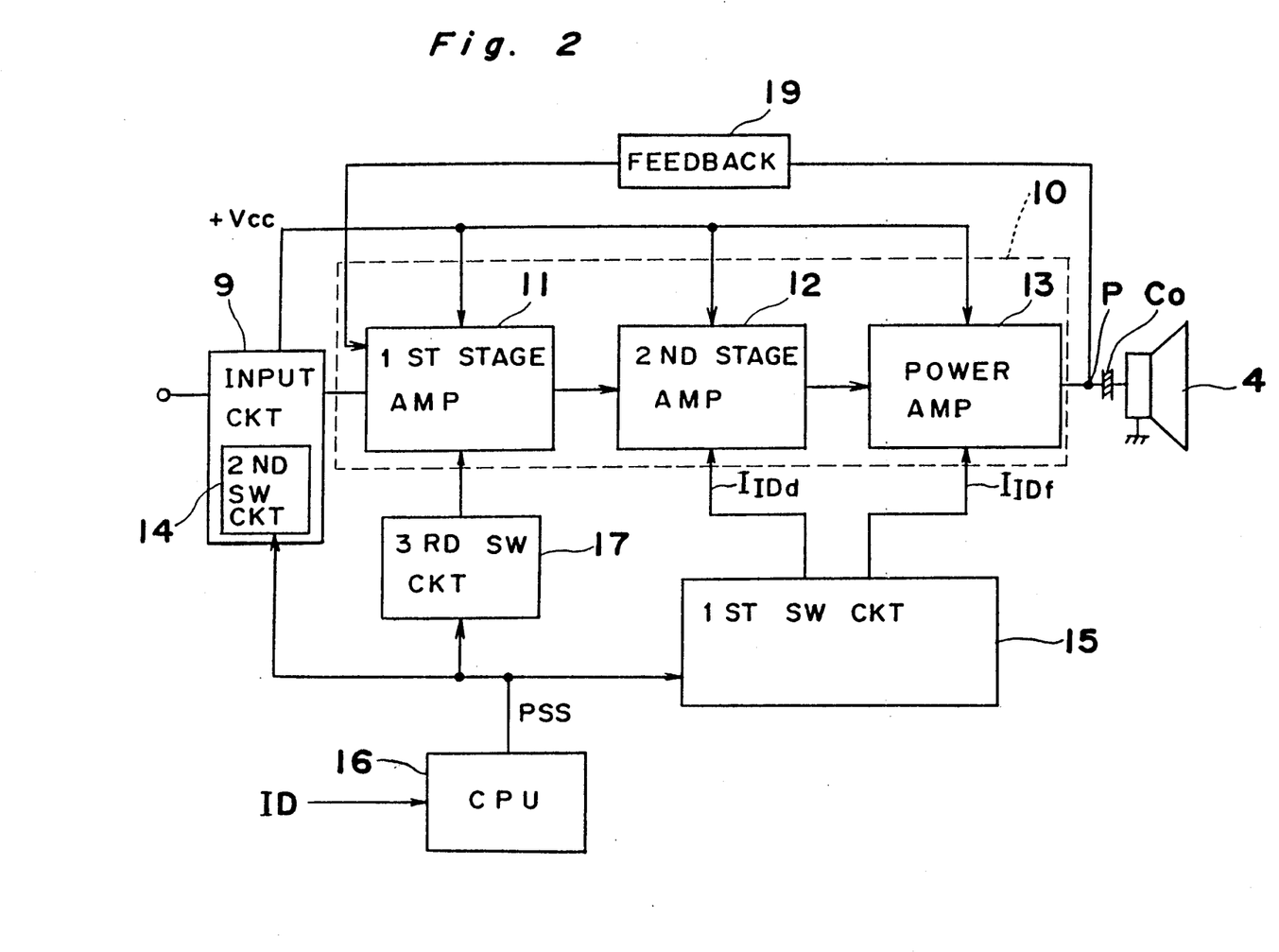
FIG. 2 is a block diagram showing a principle of a power-saving low-frequency power amplifier according to a first embodiment of the present invention.

Referring to FIG. 2, a block diagram of a power saving low frequency power amplifier according to a first embodiment of the present invention is shown.

It is to be noted that although the circuits shown in the preferred embodiments are described as employed in a handset unit of a cordless telephone for receiving data signal, such as audio signal, from the base unit (not shown), such circuits can be employed in any other units which is powered by battery, or the like, for the purpose of saving power.

The power saving low frequency power amplifier according to the present invention employs an active/semi-inactive power saving system.

The data signal emitted from the base unit is received by an antenna (not shown) in the handset unit and is suitably processed in a processing circuit (not shown). The processed data signal from the processing circuit is then applied to a power saving low frequency power amplifier of the present invention which comprises input circuit 9 for receiving the processed data signal, a first stage amplifier 11, second stage amplifier 12 and power amplifier 13. The output signal from power amplifier 13 is applied through an output coupling capacitor Co to speaker 4. According to the preferred embodiment, amplifiers 11, 12 and 13 are formed by a monolithic IC 10, as diagrammatically shown in FIG. 3. The output of power amplifier 13 is feedback to the first stage amplifier 11 through a suitable feedback circuit 19.

The power saving low frequency amplifier according to the first embodiment further comprises a first switching circuit 15 for controlling the supply of idling currents $I_{IDd}$ and $I_{IDf}$ to amplifiers 12 and 13, respectively, a second switching circuit 14 which is provided in input circuit 9 and a third switching circuit 17 for supplying a constant operating current to first stage amplifier 11. The first, second and third switching circuits 15, 14 and 17 are preferably formed by analog switches and are controlled by power saving signal PSS produced from CPU 16 in response to the detection of ID signal indicating that data signal is being transferred from the base unit to the handset unit. Thus, during the handset being used for communication with the base unit, the power saving signal PSS is absent, and during the handset being not used for communication with the base unit, the power saving signal PSS is present.

Figure 3:
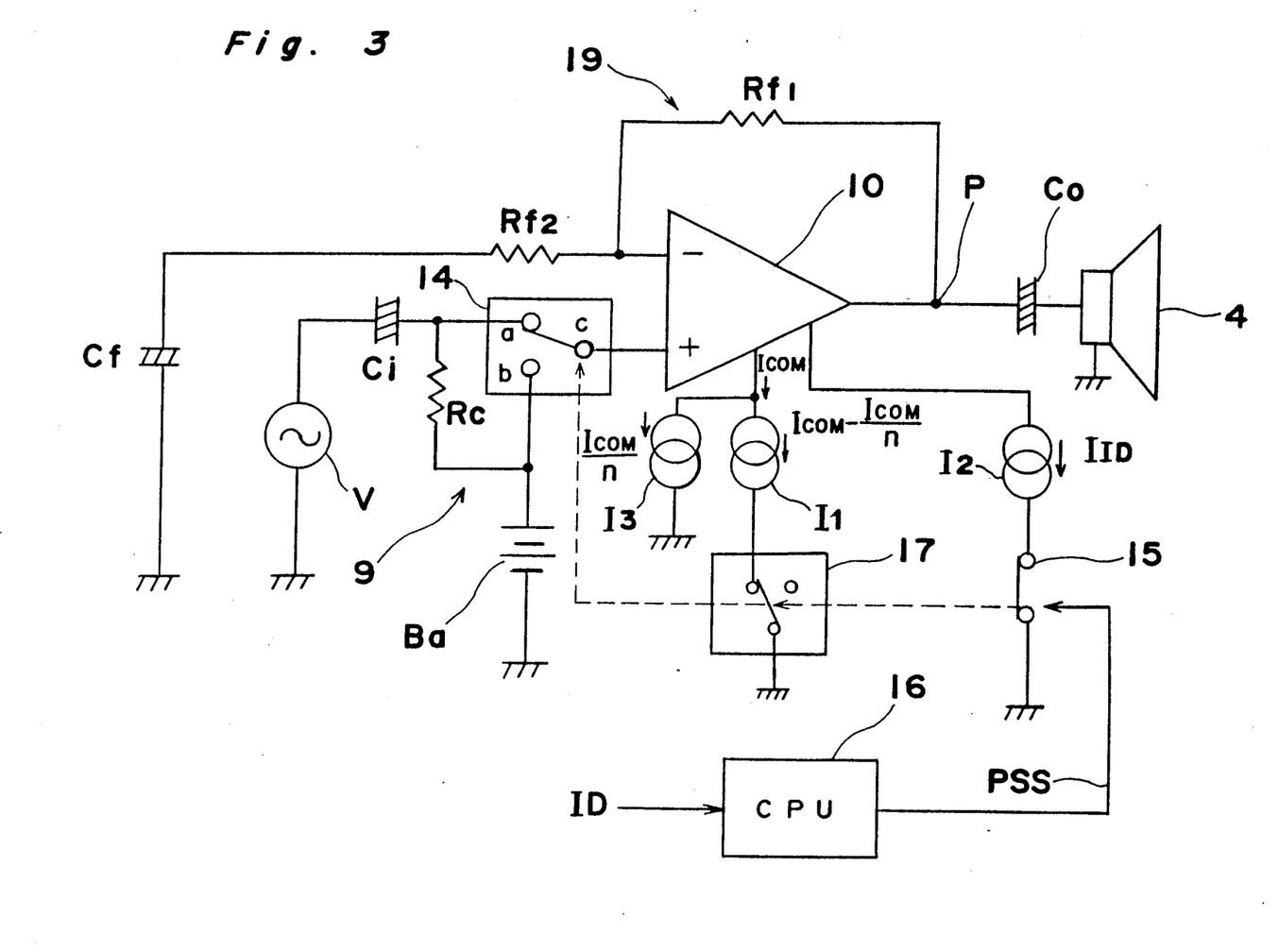
FIG. 3 is a circuit diagram of the circuit according to the first embodiment.

Referring to FIG. 3, a detail of the switching circuits 15, 14 and 17 are shown in connection with surrounding circuits. The switching circuit 15 is an ON/OFF switch and is coupled with a constant current source I2 which is provided for supplying idling current $I_{ID}$ to amplifiers 12 and 13. The switching circuit 17 is also an ON/OFF switch and is coupled with a constant current source I1 which is provided for supplying a portion of constant driving current $I_{COM}$ to the first stage amplifier I1. Another constant current source 13 is connected parallel to constant current source I1 and switch 17. The current source I1 is arrange to supply $(1-{}^1{}_n)\cdot I_{COM}$, and the current source 13 is arranged to supply ${}^1{}_n\cdot I_{COM}$. The switching circuit 14 is a two position switch having an arm c connectable to either one of contacts a and b. The arm c is connected to non-inverting input of operational amplifier 10, contact a is connected through input coupling capacitor Ci to data signal source V such as the signal processing circuit, and contact b is connected to battery Ba. A bias resistor Rc is connected between contacts a and b. The capacitor Ci, resistor Rc, battery Ba and switching circuit 14 define input circuit 9. The feedback circuit 19 is defined by resistor Rf1 connected between the output P and inverting input of operational amplifier 10 and a series connection of resistor Rf2 and capacitor Cf connected between inverting input and ground.

In operation, when the power saving signal PSS is not present, meaning that the handset is in use mode, the switching circuits 15 and 17 are both turned on, and the switching circuit 14 is turned to contact a, simultaneously, as shown in FIG. 3. Thus, by the turn on of switch 15, constant current source 12 is activated for supplying idling current $I_{ID}$ to amplifiers 12 and 13. By the turn on switch 17, a constant current source I1 is activated for supplying a portion of constant driving current $I_{COM}$ to the first stage amplifier 11 so that, together with the current from a current source 13, the first stage amplifier 11 is supplied with a full driving current $I_{COM}$. By the turning of switch 14 to contact a, data signal is applied to non-inverting input of operational amplifier 10.

When the power saving signal PSS is present, meaning that the handset is in stand-by mode, the switching circuits 15 and 17 are both turned off, and the switching circuit 14 is turned to contact b, simultaneously. By the turn off of switch 17, amplifier 10 receives minimum driving current $\cdot I_{COM}$ for driving the first stage amplifier 11 which is maintained powered on, but has no ability to amplify the input signal. By the turn off of switch 15, idling currents $I_{IDd}$ and $I_{IDf}$ to amplifiers 12 and 13, respectively, are cut off.

Accordingly, during the presence of the power saving signal PSS, the power consumed in amplifiers 11, 12 and 13 is greatly reduced to save the electric power. Also, during the presence of the power saving signal PSS, since the power to amplifiers 11, 12 and 13 are not completely cut off, the DC voltage level at output P of amplifier 13 is maintained the same as the DC voltage level observed at output P during the absence of the power saving signal PSS. Thus, the output coupling capacitor Co is maintained in charged condition even after the presence of the power saving signal PSS resulting in no shock noise produced from speaker 4 in response to the mode change, i.e., switching of switching circuits 15 and 17. The same can be said even when the feedback circuit 19 is present, since the negative feedback operation is never influenced even after the idling current IDf is cut off.

Also, during the presence of the power saving signal PSS, switching circuit 14 is turned to contact b so that noiseless signal is applied to operational amplifier 10 to improve the S/N ratio.

Figure 4:
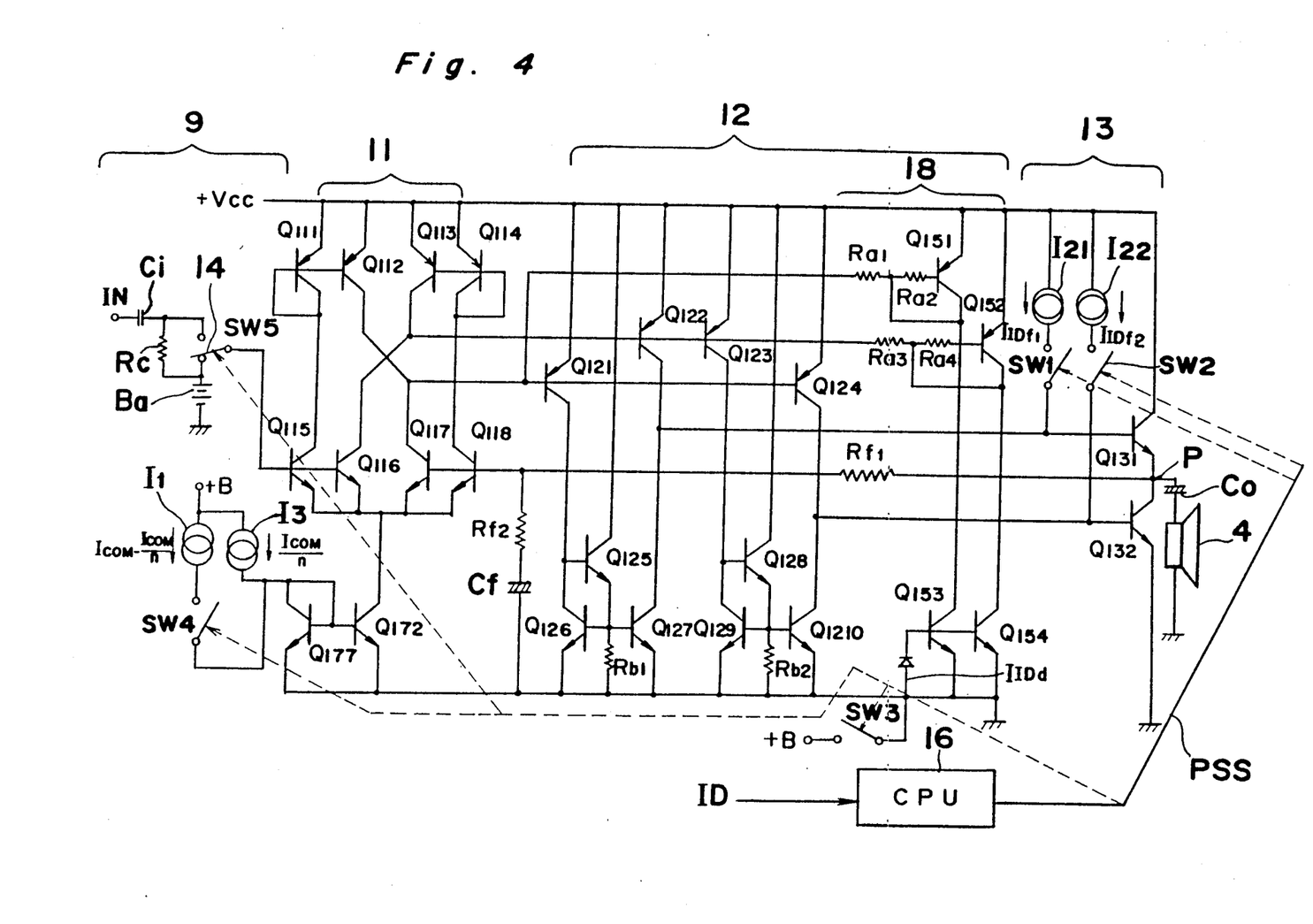
FIG. 4 is a detailed circuit diagram of the circuit according to the first embodiment.

Referring to FIG. 4, a detailed circuit diagram of the power saving low frequency power amplifier according to the first embodiment of the present invention is shown. The circuit shown is an SEPP (single ended pushpull) type power amplifier circuit.

The input circuit 9 is the same as that shown in FIG. 3. When the power saving signal PSS is present, the switching circuit 114 is turned to be connected directly to the battery Ba, as shown in FIG. 4, to provide noiseless DC voltage signal to the first stage amplifier 11. When the power saving signal PSS is absent, switching circuit 14 is so turned as to receive input data signal through input coupling capacitor Ci, and the data signal is applied to the first stage amplifier 11.

The first stage amplifier 11 is a differential amplifier which comprises PNP transistors $Q_{111}$–$Q_{114}$, NPN transistors $Q_{115}$–$Q_{118}$, and NPN transistors $Q_{177}$, $Q_{172}$ operating as a current source. A first junction between collectors or transistors Q113 and Q116 and a second junction between collectors of transistors Q112 and Q117 define double ends from which output signals of the first stage amplifier 11 are produced. A switch SW4 corresponds to switching circuit 17. When switch SW4 is opened in response to the presence of the power saving signal PSS, the differential amplifier 11 is driven with a portion $\cdot I_{COM}$ of the necessary driving current $I_{COM}$. Thus, the differential amplifier loses or reduces the amplifying ability, but merely produces from collectors of transistors $Q_{113}$ and $Q_{117}$ a DC voltage signal corresponding to input DC voltage signal from the input circuit 9. When the power saving signal PSS is absent, switch SW4 is turned on so that the differential amplifier 11 operates with full driving current $I_{COM}$ with necessary amplification.

The second stage amplifier 12 comprises PNP transistors $Q_{121}$–$Q_{124}$ and NPN transistors $Q_{125}$–$Q_{1210}$, and an idling circuit 18 for improving the switching distortion. The double end output signals as produced from the first and second junctions of the first stage amplifier 11 are applied to the bases of transistors Q122 and Q124, respectively. Idling circuit 18 includes PNP transistors $Q_{151}$, $Q_{152}$, NPN transistors $Q_{153}$, $Q_{154}$, bias resistors Ra1-Ra4 and a switch SW3. When the power saving signal PSS is present, switch SW3 opens to provide no idling current from idling circuit 18 to the bases of transistors $Q_{121}$–$Q_{124}$. Thus, amplifier 12 loses or reduces the amplifying ability and produces from collectors of transistors $Q_{122}$ and $Q_{124}$ a DC voltage signal corresponding to input DC voltage signal. When the power saving signal PSS is absent, switch SW3 closes to provide necessary idling current to transistors $Q_{121}$–$Q_{124}$ so that amplifier 12 operates with necessary amplification.

The power amplifier 13 comprises constant current sources I21 and I22 for improving the cross-over distortion, NPN transistors $Q_{131}$ and $Q_{132}$, and switches SW1 and SW2. Switches SW1, SW2 and SW3 correspond to the first switching circuit 15. When the power saving signal PSS is present, switches SW1 and SW2 open to provide no idling currents to transistors $Q_{131}$ and $Q_{132}$. Thus, transistor $Q_{131}$ and $Q_{132}$ are operated by the output DC signal from amplifier 12 to produce a predetermined DC level voltage from output P. Thus, output coupling capacitor Co is maintained in the predetermined charged condition. When the power saving signal PSS is absent, switches SW1 and SW2 close to provide necessary idling currents to transistor $Q_{131}$ and $Q_{132}$ so that power amplifier 13 operates with necessary amplification.

A negative feedback circuit is defined by elements Rf1, Rf2 and Cf, but can be eliminated when the balance in the single ended pushpull amplifier can be maintained within a tolerable range.

Figure 5:
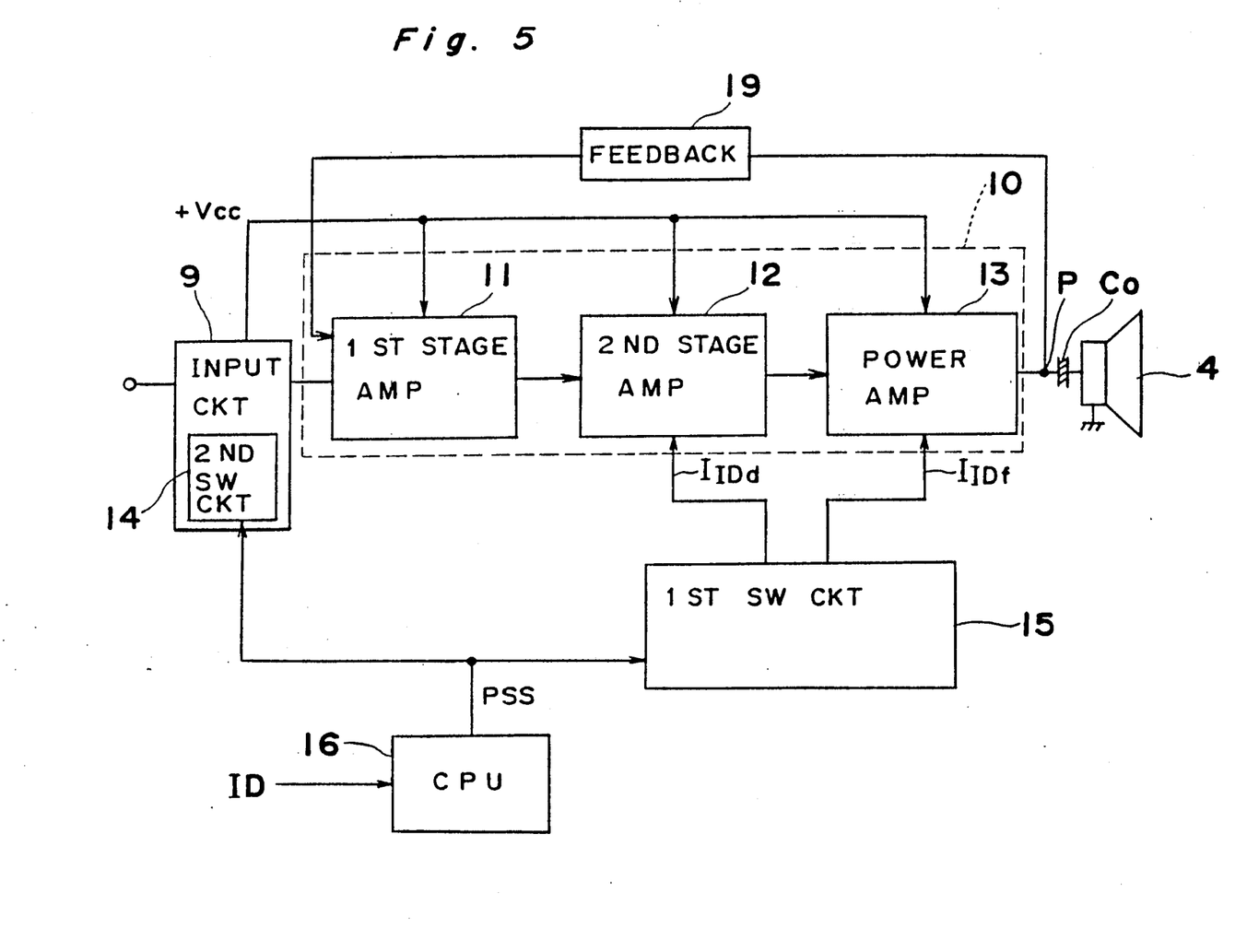
FIG. 5 is a block diagram similar to FIG. 2 but showing a second embodiment of the present invention.
Figure 6:
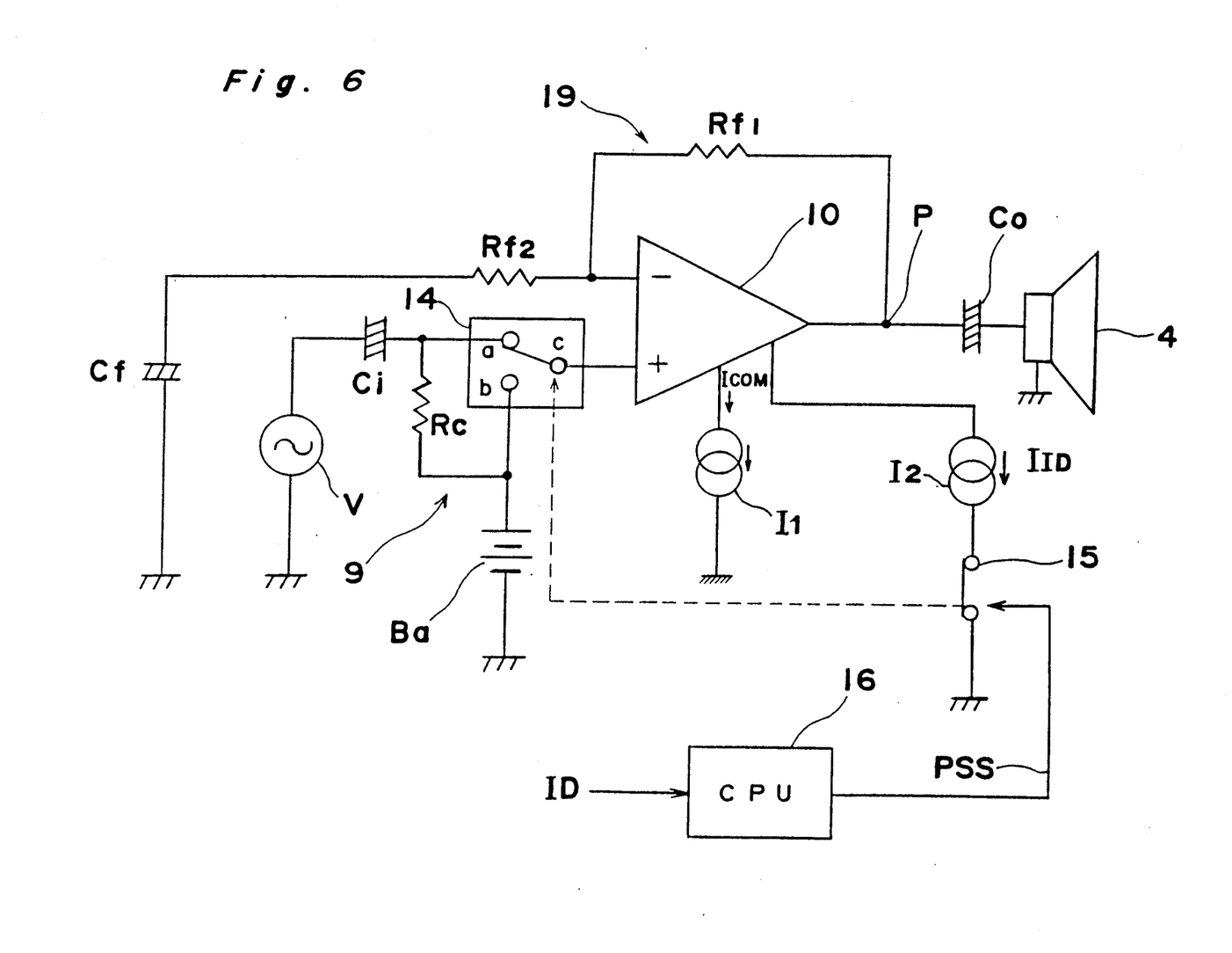
FIG. 6 is a circuit diagram similar to FIG. 3, but according to the second embodiment of the present invention.

Referring to FIGS. 5 and 6, a power saving low frequency power amplifier according to a second embodiment of the present invention is shown. When compared with the first embodiment, the third switching circuit 17 is eliminated in the second embodiment. Accordingly, as shown in FIG. 6, the first stage amplifier 11 is always driven by the driving current $I_{COM}$ from constant current source I1. In the second embodiment, the power saving is mostly done in the second stage amplifier 12 and in the power amplifier 13.

It is to be noted that since the second switching circuit 14 is provided for improving the S/N ratio during the stand-by mode, the second switching circuit 14 can also be eliminated in such a manner as to have the non-inverting input of operational amplifier 10 shown in FIG. 6 is directly to input coupling capacitor Ci.

As is fully described hereinabove, according to the present invention, since the present invention employs an active/semi-inactive power saving system, the output coupling capacitor Co can be maintained in the charged condition even during the stand-my mode. Thus, undesirable shock noise will no be produced when the mode is change from the stand-by mode to use mode, or vice versa.

Although the present invention has been full described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A power saving low frequency power amplifier comprising:
    a first stage amplifier for receiving and amplifying a data signal, said first stage amplifier being operated in response to a driving current to produce an output;
    a second stage amplifier for amplifying the output of said first stage amplifier, said second stage amplifier receiving a first idling current via a path for obtaining a predetermined amplification to produce another output;
    a power amplifier for amplifying the another output of said second amplifier, said power amplifier receiving a second idling current via another path for obtaining a predetermined amplification;
    switching means for making and breaking at least one of said paths for said first and second idling currents;
    control means for producing a power save signal to said switching means for causing said switching means to effect said breaking when said power save signal is present; and
    another switching means for cutting off the data signal and for supplying a stable DC voltage to said first stage amplifier when said power save signal is present.

2. A power saving low frequency power amplifier, comprising:
    a first stage amplifier for receiving and amplifying an input signal, said first stage amplifier being operated in response to a driving current to produce an output;

a second stage amplifier for amplifying the output of said first stage amplifier so as to produce another output;

a power amplifier for amplifying the another output of said second stage amplifier to produce a power amplifier voltage;

a negative feedback circuit for maintaining constant said power amplifier output by feeding back said power amplifier output as input to said first stage amplifier;

a first idling means connected in a path to said second stage amplifier for supplying a first idling current to said second stage amplifier;

a second idling means connected in another path to said power amplifier for supplying a second idling current to said power amplifier;

first switching means for making and breaking at least one of said paths for said first and second idling currents; and control means for producing a power save signal to said first switching means which causes said first switching means to effect said breaking when said power save signal is present to thereby suppress power consumption and for maintaining constant said power amplifier voltage irrespective of said making and breaking of said paths by said switching means.

3. A power saving low frequency power amplifier as in claim 2, further comprising second switching means responsive to production of said power save signal for inhibiting supply of part of said driving current to said first stage amplifier.

4. A power saving low frequency power amplifier as in claim 3, further comprising a first constant current source for applying said driving current, said first constant current source being connected to said first stage amplifier via said second switching means, a second constant current source normally connected to said first stage amplifier, said second switching means being responsive to production of said power save signal for breaking connection to said first stage amplifier so as to leave said first stage amplifier to be powered only by said second constant current source.

5. A power saving low frequency power amplifier as in claim 2, further comprising a second switching means responsive to said power save signal being present for cutting of the input signal and for supplying a stable DC voltage to said first stage amplifier.

6. A power saving low frequency power amplifier as in claim 2, further comprising:

second switching means for breaking connection for supplying part of said driving current to said first stage amplifier in response to a presence of said power save signal, said power save signal being produced in response to detection of an ID signal in the input signal; and third switching means for cutting off the data signal and for supplying a stable DC voltage to said first stage amplifier in response to a presence of said power save signal.

7. A power saving low frequency power amplifier as claimed in claim 2, wherein said first stage amplifier includes a first input applied with said input signal, a second input connected with said negative feedback circuit, and means for subjecting said input signal to differential amplification to produce output signals at double ends of the first stage amplifier.

8. A power saving low frequency power amplifier as claimed in claim 7, wherein said second stage amplifier includes first and second transistors connected to the double end output of said first stage amplifier, said first idling means supplying said first idling current to the bases of said first and second transistors.

9. A power saving low frequency power amplifier as claimed in claim 8, wherein said power amplifier includes transistors of push-pull connection respectively connected to outputs of said first and second transistors of said second stage amplifier, said second idling means supplying said second idling current to the bases of the transistors of the push-pull connection.

* * * * *